United States Patent [19]

Cheng et al.

[11] Patent Number: 5,004,555
[45] Date of Patent: Apr. 2, 1991

[54] HEAT CYCLE TREATMENT FOR IMPROVING THE PERFORMANCE OF PIEZOELECTRIC CERAMICS

[75] Inventors: Syh Y. Cheng, Taichung; Hong W. Wang, Kaohisung, both of Taiwan

[73] Assignee: Industrial Technology Research Institute, Taiwan

[21] Appl. No.: 429,704

[22] Filed: Oct. 31, 1989

[51] Int. Cl.$^5$ ............... C04B 35/49; C04B 35/00
[52] U.S. Cl. ............................................. 252/62.9
[58] Field of Search ........................ 252/62.9, 62.9 R

[56] References Cited

U.S. PATENT DOCUMENTS

| | | | |
|---|---|---|---|
| 3,372,121 | 3/1968 | Banno | 252/62.9 |
| 3,899,435 | 8/1975 | Minai et al. | 252/62.9 |
| 4,124,671 | 11/1978 | Walker et al. | 252/62.9 |
| 4,355,256 | 10/1982 | Perduijn et al. | 252/62.9 |
| 4,383,196 | 5/1983 | Perduijn et al. | 252/62.9 |

Primary Examiner—Jacqueline V. Howard
Assistant Examiner—E. McAvoy
Attorney, Agent, or Firm—Scully, Scott, Murphy & Presser

[57] ABSTRACT

A process for improving the electromechanical coupling factor (Kp) of a polarized piezoelectric ceramics by thermal cycle treatment. The process comprises the steps of:

(a) keeping the polarized piezoelectric ceramics at a temperature of from 50° to 130° C. for from 10 to 60 minutes;

(b) cooling the polarized piezoelectric ceramics to room temperature rapidly;

(a) repeating steps (a) and (b) until the electromechanical coupling factor of the polarized piezoelectric ceramics saturates.

The process of the present invention is effective in elevating the electromechanical coupling factor (Kp) of a polarized piezoelectric ceramics by an degree of from 3 to 8 percent. The useful life of the polarized piezoelectric ceramics is therefore elongated.

10 Claims, 3 Drawing Sheets

HEAT CYCLE TREATMENT FOR IMPROVING THE PERFORMANCE OF PIEZOELECTRIC CERAMICS

BACKGROUND OF THE INVENTION

Piezoelectric ceramic materials are ceramic materials capable of generating a voltage when mechanical force is applied or producing a mechanical force when a voltage is applied.

The performance of a piezoelectric ceramic material is measured mainly by its electromechanical coupling factor (Kp), mechanical quality factor (Qm), ferroelectric constant (K) and dissipation factor (tan δ).

In the production of piezoelectric ceramics, the raw materials are mixed, ball-milled, fired, further ball-milled and then sintered. The sintered body is then polished on both sides, adapted with electrodes and then polarized in a silicon oil bath of about 130° C. by applying a high voltage direct current field (usually from 2.5 to 3.5 kV/mm) for from about 10 to about 30 minutes.

The properties of a piezoelectric ceramic is determined primarily by the composition of the raw materials, the process parameters of the production and the completeness of polarization. The performance of a piezoelectric ceramic will unavoidably deteriorate after a certain period of usage. For example, the Kp value of 0.50 right after polarization will spontaneously decrease to 0.48–0.49. To improve the useful life and the efficiency of the piezoelectric ceramics, it has been tried to adopt more critical process or use higher polarization voltage for the production of the piezoelectric ceramics to increase the initial Kp value. However, critical process is quite costly and higher polarization voltage will adversely affect the structure of the final product. It is desirable to improve the performance of piezoelectric ceramics by other simpler and non-destructive methods.

Japanese Laid-Open Patent Application No. JP63-131407 discloses a process to increase the dielectric constant, resonance frequency and resonance impedance of polarized piezoelectric ceramics by applying a constant temperature heat-treatment at a temperature lower than half of the Curie temperature for about 5–15 hours. The Kp value, however, is decreased.

Deutsche Patent No. DE 1796226 discloses a process to decrease the aging rate of piezoelectric ceramic materials by a heat treatment of repeated heating and cooling cycle. The heating and cooling rate is lower than 30°/hr. Although the frequency constant of the piezoelectric ceramics is stabilized, the Kp value is decreased.

SUMMARY OF THE INVENTION

It is therefore an object of the present invention to provide a process to improve the Kp value of piezoelectric ceramics by simple heat treatment and subsequently improve the useful life of the piezoelectric ceramics.

The present invention relates to a process for improving the electromechanical coupling factor (Kp) of a polarized piezoelectric ceramics by thermal cycle treatment, said process comprising the steps of:

(a) keeping said polarized piezoelectric ceramics at a temperature of from 50° to 130° C. for from 10 to 60 minutes;

(b) cooling said polarized piezoelectric ceramics to room temperature rapidly;

(a) repeating steps (a) and (b) until the electromechanical coupling factor of said polarized piezoelectric ceramics saturates.

The process of the present invention is effective in elevating the electromechanical coupling factor (Kp) of a polarized piezoelectric ceramics by an degree of from 3 to 8 percent. The useful life of the polarized piezoelectric ceramics is therefore elongated.

DETAILED DESCRIPTION OF THE INVENTION

The individual elements of the present invention will be described in detail below.

Barium titanate ($BaTiO_3$) is the firstly developed piezoelectric ceramic material. In 1954, new piezoelectric ceramic materials based on a binary system of lead zirconate-titanate ($Pb(Zr,Ti)O_3$, commonly called PZT) was discovered. Due to its superior piezoelectric property, lead zirconate-titanate has become the predominant piezoelectric material in the market since its discovery.

The piezoelectric ceramics contemplated by the present invention is preferably a piezoelectric ceramics of the lead series, more preferably a piezoelectric ceramics of the PZT type.

Conventional PZT piezoelectric elements are produced first by mixing powers of lead oxide, zirconium oxide, titanium oxide and necessary additives. The mixture is then ball-milled, dried and subsequently fired and crushed to give the base ceramic powder. The ceramic powder is then sieved and pressed into the desired green body. The green body is then sintered. The sintered body is then polished, adapted with electrodes and polarized. In conventional process, the polarized piezoelectric ceramic element is directly utilized. The average Kp value of conventional piezoelectric ceramic elements are from about 0.44 to about 0.56.

According to the present invention, the polarized piezoelectric ceramic elements are further subjected to a specific thermal cycle treatment. As a result, the Kp values are increased by from about 3% to about 8%, reaching from 0.48 to 0.56.

Aging rate of the processed piezoelectric ceramic elements are the same as those not processed by the present invention. However, since Kp value of the processed elements are elevated, the useful life of the processed elements are elongated since the elements age from a higher Kp value. Furthermore, the piezoelectric will have better performance with higher Kp value.

EXAMPLE

Five groups of Sr-containing PZT piezoelectric ceramic test plates were plated with electrodes. Each group of test plates includes three test plates of the same composition. The compositions of the Sr-containing PZT piezoelectric ceramic test plates may be represented by the general formula:

$$(Pb_{1-x}Sr_x)[(Zr_{0.52}Ti_{0.48})_{0.97}Nb_{0.03}]O_3.$$

Figure 1A:
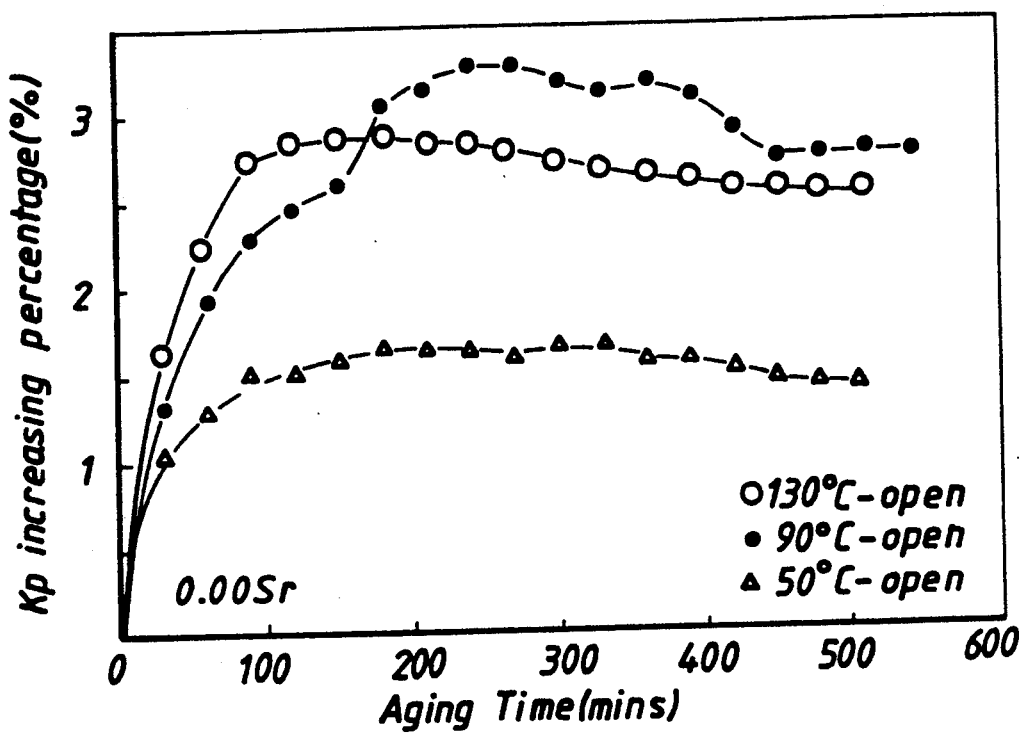
FIGS. 1(a)–1(e) show the results of the relation between the Kp value and the thermal cycle treatment as illustrated in the example.
Figure 1B:
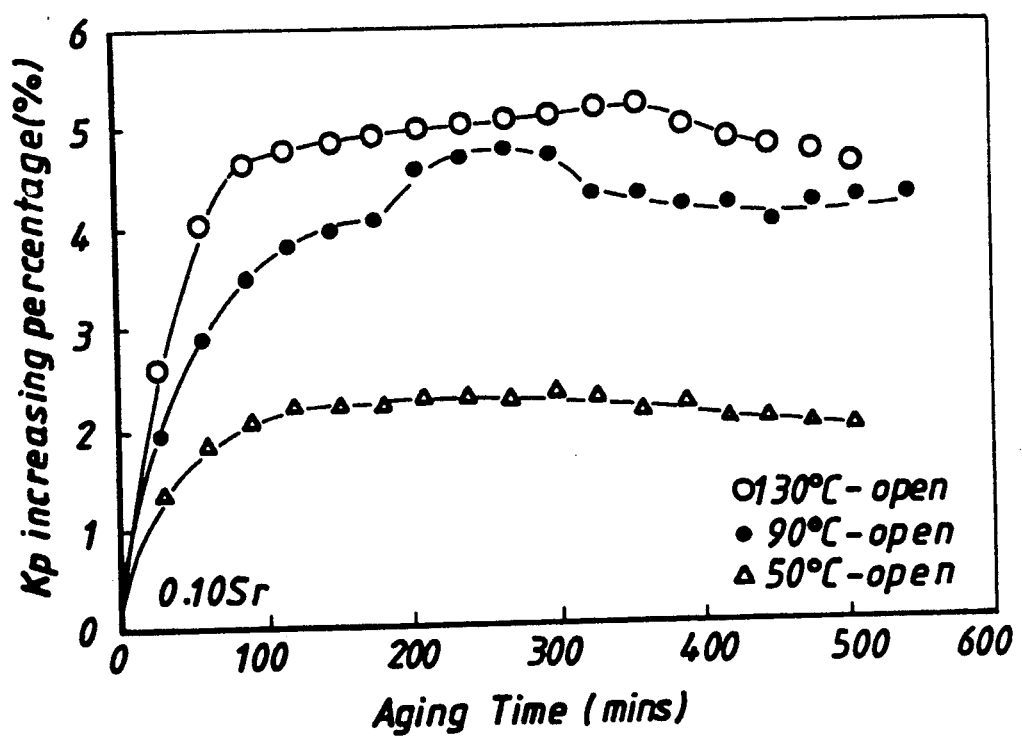
Figure 1C:
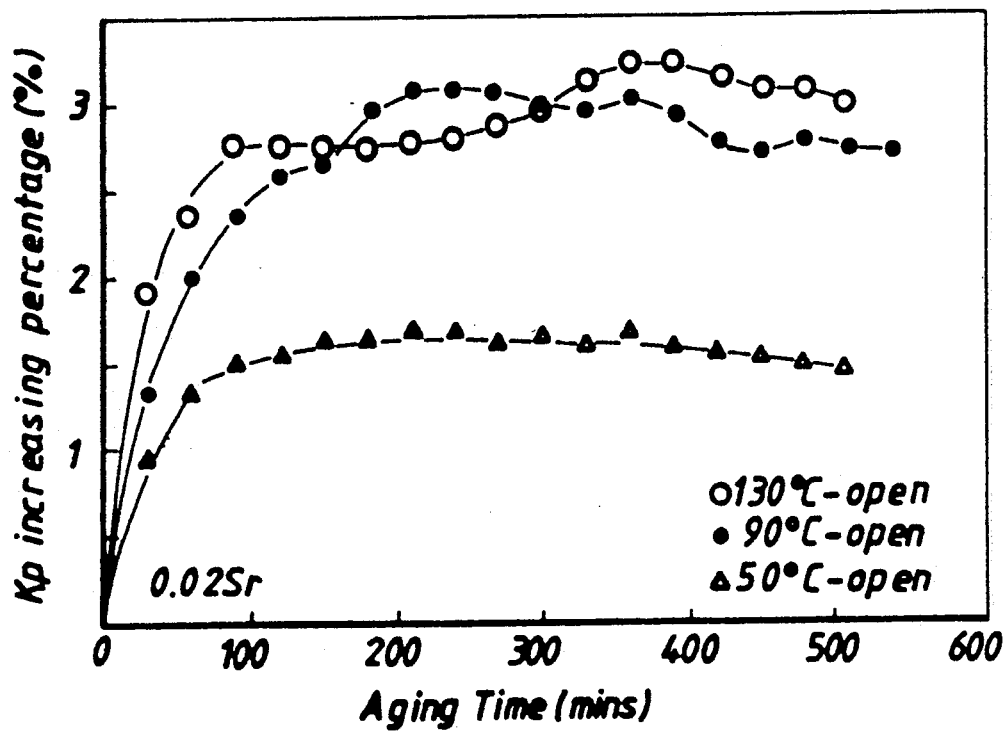
Figure 1D:
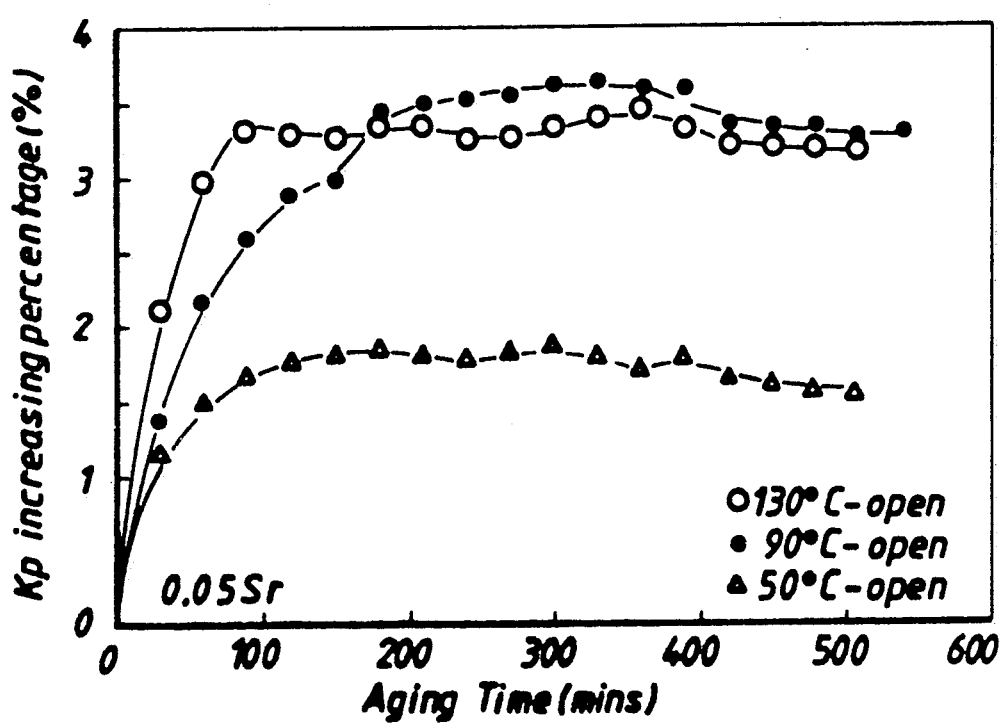
Figure 1:
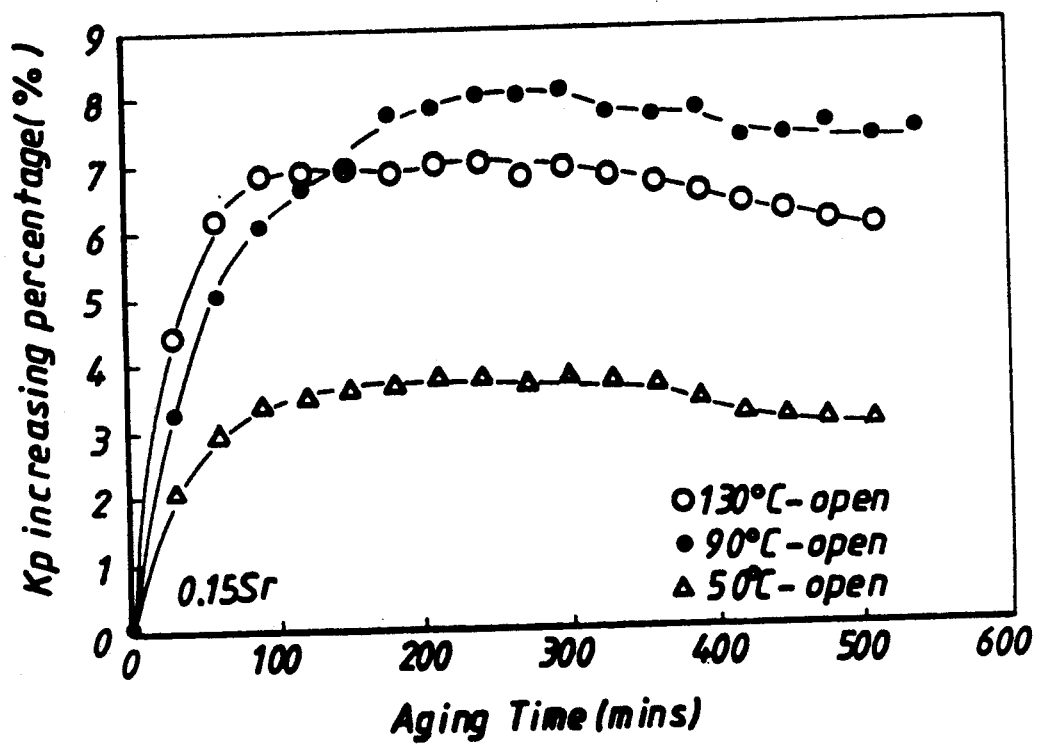

The x values for each of the five groups of test plates were 0, 0.02, 0.05, 0.10 and 0.15 respectively. Test plates of same composition were rapidly moved individually into an oven set at 50° C., 90° C. and 130° C. respectively for 20 minutes. The samples were then removed from the oven and was allowed to cool down to room temperature. The Kp value of the samples were then evaluated. The heating-cooling cycles were repeated more than 10 times. The results were depicted in FIGS. 1(a)–1(e). It was found that the Kp values of the samples reached a saturation level after 4–6 such thermal cycles. The Kp values did not increase after they reach their respective saturation level even though further thermal cycles were applied. The drawings show that the Kp values of these polarized piezoelectric PZT ceramics were significantly raised. The Kp values of the samples were raised by an degree from about 3 to about 8%. The highest increase in Kp value was found in the sample which contained 0.15 mole% of Sr and was heated under 90° C. With the increase in initial Kp value, the efficiency of the piezoelectric ceramics is improved and it useful life were also elongated.

We claim:

1. A process for the electromechanical coupling factor (Kp) of a polarized piezoelectric ceramics by thermal cycle treatment, said process comprising the steps of:

(a) keeping said polarized piezoelectric ceramics at a temperature of from 50° to 130° C. for from 10 to 60 minutes;

(b) cooling said polarized piezoelectric ceramics to room temperature rapidly;

(a) repeating steps (a) and (b) until the electromechanical coupling factor of said polarized piezoelectric ceramics saturates.

2. The method of claim 1, wherein said polarized piezoelectric ceramics is a $Pb(Zr, Ti)O_3$ type.

3. The method of claim 2, where the composition of said ceramics is:

$$(Pb_{1-x}Sr_x)[(Zr_{0.52}Ti_{0.48})_{0.97}Nb_{0.03}]O_3$$

where x has a value from 0 to about 0.15.

4. The method of claim 1, where said steps (a) and (b) are repeated so that said ceramics are kept at said temperatures of from 50° C. to 130° C. for from 10 to 60 minutes for a total time in this repeated process from about 100 minutes to about 400 minutes.

5. The method of claim 2, where said steps (a) and (b) are repeated so that said ceramics are kept at said temperatures of from 50° C. to 130° C. for from 10 to 60 minutes for a total time at said temperatures of from about 100 minutes to about 400 minutes.

6. The method of claim 3, wherein said steps (a) and (b) are repeated so that said ceramics are kept at said temperatures of from 50° C. to 130° C. for from 10 to 60 minutes for a total time at said temperatures of from about 100 minutes to about 400 minutes.

7. The method of claim 2, where said ceramics contain about 0.15 mole percent of Sr and are heated at a temperature under 90° C.

8. The method of claim 3, where said ceramics contain about 0.15 mole percent of Sr and are heated at a temperature under 90° C.

9. The method of claim 5, where said ceramics contain about 0.15 mole percent of Sr and are heated at a temperature under 90° C.

10. The method of claim 6, where said ceramics contain about 0.15 mole percent of Sr and are heated at a temperature under 90° C.

* * * * *

UNITED STATES PATENT AND TRADEMARK OFFICE
CERTIFICATE OF CORRECTION

PATENT NO. : 5,004,555

DATED : April 2, 1991

INVENTOR(S) : Syh-Yuh Cheng, et al.

It is certified that error appears in the above-identified patent and that said Letters Patent is hereby corrected as shown below:

Column 3, line 24, Claim 1: "for the" should read as --for improving the--

Signed and Sealed this

First Day of September, 1992

*Attest:*

DOUGLAS B. COMER

*Attesting Officer*     *Acting Commissioner of Patents and Trademarks*